(12) United States Patent
Solomon

(10) Patent No.: US 6,948,139 B2
(45) Date of Patent: Sep. 20, 2005

(54) METHOD FOR COMBINING STATES

(75) Inventor: Richard L. Solomon, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 113 days.

(21) Appl. No.: 10/326,717

(22) Filed: Dec. 19, 2002

(65) Prior Publication Data

US 2004/0123251 A1 Jun. 24, 2004

(51) Int. Cl.[7] .............................................. G06F 17/50
(52) U.S. Cl. .................................. 716/2; 716/1; 716/3
(58) Field of Search ........................ 716/1–21; 707/101

(56) References Cited

U.S. PATENT DOCUMENTS

| 5,537,580 | A | * | 7/1996 | Giomi et al. ................ 716/19 |
|---|---|---|---|---|
| 5,933,385 | A | * | 8/1999 | Jiang et al. ............ 365/230.01 |
| 6,041,176 | A | * | 3/2000 | Shiell ............................ 703/27 |
| 6,181,639 | B1 | * | 1/2001 | Weinfurtner ................. 365/233 |
| 6,182,268 | B1 | * | 1/2001 | McElvain ....................... 716/1 |
| 6,212,625 | B1 | * | 4/2001 | Russell ........................ 712/217 |
| 6,298,472 | B1 | * | 10/2001 | Phillips et al. ................. 716/18 |
| 6,487,704 | B1 | * | 11/2002 | McNamara et al. ........... 716/5 |
| 6,489,817 | B1 | * | 12/2002 | Wong et al. ................. 327/115 |
| 2004/0002845 | A1 | * | 1/2004 | Akiba et al. .................. 703/14 |
| 2004/0064752 | A1 | * | 4/2004 | Kazachinsky et al. ...... 713/500 |

* cited by examiner

Primary Examiner—Stacy A. Whitmore
Assistant Examiner—Magid Y. Dimyan
(74) Attorney, Agent, or Firm—Suiter West Swantz PC LLO

(57) ABSTRACT

A method for combining states of a state machine employs manipulation of case statements in the RTL code implementing the state machine to allow selectable state combinations without duplication of code so that errors inherent in maintaining duplicate copies of the same RTL code may be eliminated.

33 Claims, 2 Drawing Sheets

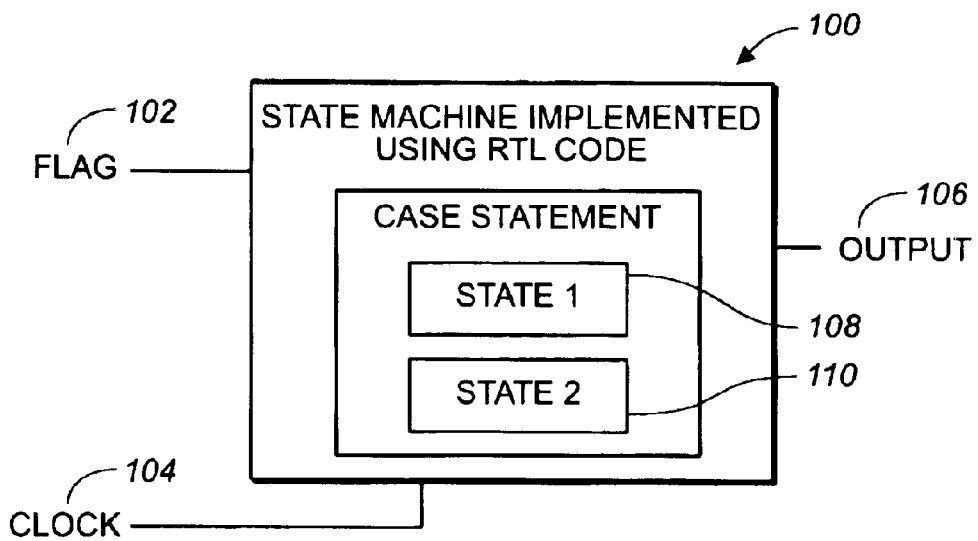
FIG._1
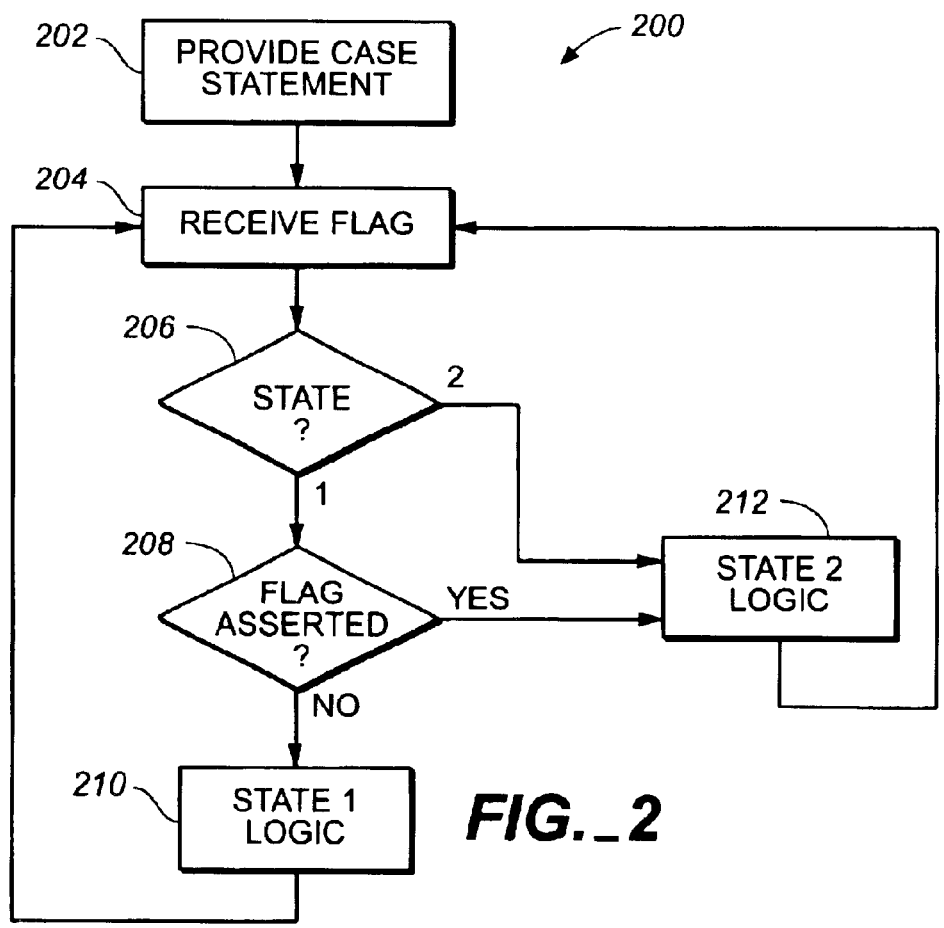
FIG._2

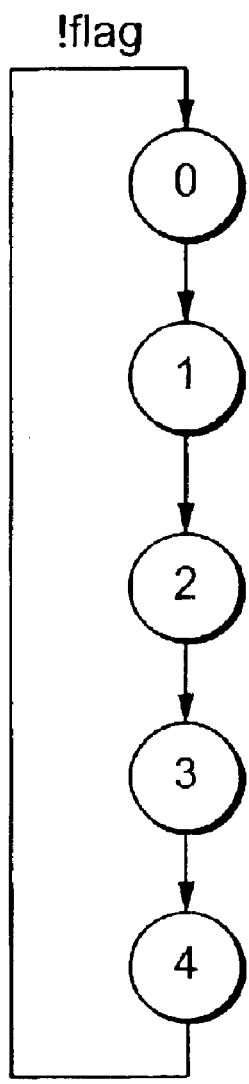
FIG._3
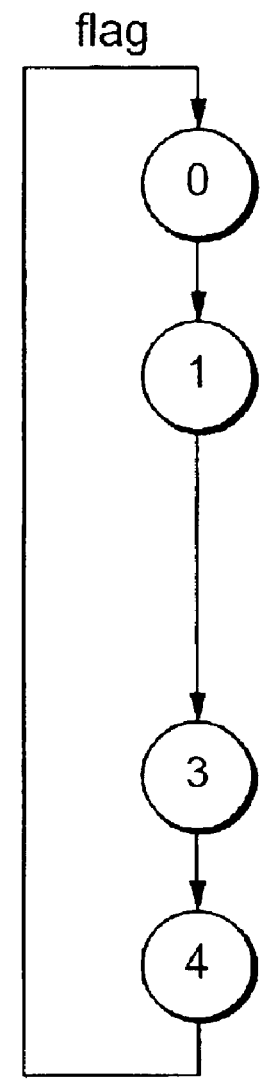
FIG._4

METHOD FOR COMBINING STATES

FIELD OF THE INVENTION

The present invention generally relates to the field of RTL (Register Transfer Level) coding, and particularly to RTL coding of state machines wherein two states within the state machine are combined into one based on a signal outside of the state machine.

BACKGROUND OF THE INVENTION

State machines are often used by designers to implement sequential logic function to control the behavior of a machine, circuit, or system. With a state machine, the designer may control all state outputs and transitions for any given input. In the past, state machines were implemented in hardware using logic gates, manually specified with via a schematic. A disadvantage of such state machines is that once a design has been implemented, changing the control functions of the state machine requires redesigning the hardware circuit thereby making any changes difficult or impractical to effect. Consequently, state machines are increasingly being implemented in hardware description languages such as VHDL or Verilog. One advantage of implementing state machines in software is that doing so provides flexibility to modify or alter the control functions of the state machine since a designer or programmer may modify and recompile the source code to implement desired changes.

Because of performance and design considerations, it may be desirable to pass from one state to another within a state machine without occupying an extra clock cycle by combining the two states based on a signal outside the machine. Since state transitions outside of a clock boundary are impossible to implement in a synchronous environment, the designer must combine the logic from one state into a second state. A "flag" signal is then used to select the logic or decisions of the first state while the state machine is actually in second state. In this manner, the state machine need not actually enter the first state and can remain synchronous. However, using this method, RTL code for both states must be duplicated in each state. When RTL code is duplicated in this manner, subtle errors in the code can occur if all copies of the code are not updated together. Moreover, as the RTL code of the state machine is written, portions of the code may be duplicated incorrectly due to human error. Consequently, it would be desirable to provide a method for combining states of a state machine without maintaining duplicate copies of the same RTL code.

SUMMARY OF THE INVENTION

Accordingly, the present invention is directed to a method for combining states of a state machine without maintaining duplicate copies of the same RTL code. The method employs manipulation of case statements in RTL code to allow selectable state combination without duplication of RTL code so that errors inherent in maintaining multiple copies of the RTL code are eliminated.

In one exemplary embodiment, the present invention provides a method for combining a first state and a second state of a state machine, wherein the state machine is implemented using RTL code. The method comprises providing a case statement in the RTL code implementing the state machine. The case statement allows selectable combination of the first state and the second state without duplication of RTL code implementing either of the first state or the second state based on a signal from outside of the state machine. In this manner, the RTL code implementing either the first state or the second state may then be executed based on whether the received signal is asserted.

In a second exemplary embodiment, the present invention provides a state machine implemented using RTL code. The state machine includes at least a first state and a second state. A case statement in the RTL code implementing the state machine provides selectable combination of the first state and the second state without duplication of RTL code implementing either of the first state or the second state based on a signal from outside of the state machine.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a block diagram illustrating a state machine in accordance with an exemplary embodiment of the present invention;

FIG. 2 is a flow diagram illustrating an exemplary method for combining states of a state machine without maintaining duplicate copies of the same RTL code in accordance with the present invention;

FIGS. 3 and 4 are state diagrams illustrating an exemplary "one hot" state machine in accordance with the present invention.

DETAILED DESCRIPTION OF THE INVENTION

Reference will now be made in detail to the presently preferred embodiments of the invention, examples of which are illustrated in the accompanying drawings.

Referring generally to FIGS. 1 through 4, a method for combining states of a state machine without maintaining duplicate copies of the same RTL code in accordance with an exemplary embodiment of the present invention is described. The method employs manipulation of case statements in RTL code (e.g., Verilog, VHDL, or the like) to allow selectable state combination without duplication of code. In this manner, error inherent in maintaining multiple copies of the RTL code is eliminated.

FIG. 1 illustrates a state machine 100 in accordance with an exemplary embodiment of the present invention. State machine 100 implements sequential logic functions to control the behavior of a machine, circuit, or system. In the embodiment illustrated in FIG. 1, state machine 100 receives an input signal "FLAG" 102 and a clock signal "CLOCK" 104, and provides an output signal "OUTPUT" 106. State machine 100 includes two states, "STATE 1" 108 and "STATE 2" 110. However, it will be appreciated that state machine 100 of the embodiment illustrated in FIG. 1 is simplified for purposes of illustration of the present invention. In other embodiments, state machines in accordance with the present invention may include more than two states depending on the logic functions being implemented.

Moreover, such state machines may receive input signals other than "FLAG" 102 and/or provide output signals other than "OUTPUT" 106 without departing from the scope and intent of the present invention.

The present invention allows state machine 100 to pass from a first state ("STATE 1" 104) to a second state ("STATE 2" 106) without occupying an extra clock cycle by combining the first state and the second state based on a signal outside state machine 100 (the input signal "FLAG" 102). Preferably, the input signal "FLAG" 102 is used to select the logic or decisions of the second state ("STATE 2" 106) while state machine 100 is in the first state ("STATE 1" 104). This selection is accomplished by manipulating the case statements in the RTL code implementing state machine 100. In this manner, state machine 100 need not actually enter the second state ("STATE 2" 106) and can remain synchronous. Moreover, the present invention allows the states of state machine 100 to be combined without maintaining duplicate copies of the same RTL code implementing the states.

Referring now to FIG. 2, an exemplary method for combining states of a state machine without maintaining duplicate copies of the same RTL code is described. The method 200 includes the steps of manipulating the case statements in the RTL code implementing the state machine to allow selectable state combination without duplication of RTL code at step 202. A flag signal ("FLAG") is received to the state machine having at least two states ("STATE 1" and "STATE 2") at step 204. If the state machine is in a first state ("STATE 1") at step 206 and the flag signal is asserted at step 208, the state machine executes the first state ("STATE 1") logic at step 210. However, if the state machine is in the first state ("STATE 1") at step 206 and the flag signal ("FLAG") is not asserted at step 208, or the state machine is in the second state ("STATE 2") at step 206, the state machine executes the second state ("STATE 2") logic at step 212. In this manner, the second state ("STATE 2") logic need not be duplicated in the first state ("STATE 1"). The first state ("STATE 1") logic is skipped when the flag signal ("FLAG") is asserted or true, and the second state ("STATE 2") logic is executed despite the fact that the state machine is actually in the first state ("STATE 1").

With reference to FIGS. 3 and 4, simple "one hot" state machine is now described by way of example for further illustrating the method of the present invention. In a "one hot" state machine, only one state bit is asserted for any given state. All other state bits are unasserted. Exemplary RTL code (Verilog code is illustrated) implementing such a "one hot" state machine is provided below.

```
reg [4:0] State, nextState;
always @(posedge Clk)
  begin
    State = nextState;
    $display("Test: %b @ %0t", State, $time);
    if (State[4]) $finish;
  end
always @(State or nextState)
  begin
    nextState = 0;
    case (1'b1)
      State[0]:
        begin
          nextState[1] = 1;
          $display("State %b => nextState %b @ %0t", State,
            nextState, $time);
        end
```

-continued

```
      State[1]:
        begin
          nextState[2]=1;
          $display("State %b => nextState %b @ %0t", State,
            nextState, $time);
        end
      State[2]:
        begin
          nextState[3] = 1;
          $display("State %b => nextState %b @ %0t", State,
            nextState, $time);
        end
      State[3]:
        begin
          nextState[4] = 1;
          $display("State %b => nextState %b @ %0t", State,
            nextState, $time);
        end
      State[4]:
        begin
          nextState[0] = 1;
          $display("State %b => nextState %b @ %0t", State,
            nextState, $time);
        end
    endcase
  end
```

When run in simulation, the state machine implemented by this RTL code produces the following output:

```
Compiling source file "test.v"
Highest level modules:
  test
Test: 00001 @ 4
  State 00001 => nextState 00010 @ 4
Test: 00010 @ 12
  State 00010 => nextState 00100 @ 12
Test: 00100 @ 20
  State 00100 => nextState 01000 @ 20
Test: 01000 @ 28
  State 01000 => nextState 10000 @ 28
Test (0): 10000 @ 36
L27 "test.v": $finish at simulation time 36
```

Thus, the state machine requires 36 time units to complete State 4.

As discussed in the description of FIG. 1, for various performance or design reasons, it may be desirable to pass from State 1 into State 2 without occupying an extra clock cycle or cycles. However, because state transitions outside of a clock boundary are impossible to implement in a synchronous environment, such a state machine would generally combine the logic from State 2 into State 1, qualified with some flag signal (e.g., input signal "FLAG" 102 shown in FIG. 1) to select the set of State 2 decisions while the state machine was actually in State 1. In this manner, the state machine does not actually enter State 2 and can remain synchronous. Traditionally, this would require the following change to the RTL code provided above.

```
State[1]:
  begin
    if (flag)
      begin
        // Duplicate State[2] logic here
        nextState[3] = 1;
      end
    else
```

```
    begin
    // Existing State[1] logic here
    nextState[2] = 1;
    end
    $display("State %b => nextState %b @ %0t", State, nextState, $time);
    end
State[2]:
    begin
    // Duplicate State[2] logic here
    nextState[3] = 1;
    $display("State%b => nextState %b @ %0t", State, nextState, $time);
    end
```

RTL code for both State 1 and State 2 is duplicated in each state (e.g., "//Duplicate State[2] logic here"). However, when RTL code is duplicated in this manner, subtle errors in the RTL code can occur if all copies of the code are not updated together. Moreover, as the RTL code of the state machine is written, portions of the code may be duplicated incorrectly due to human error.

In accordance with the present invention, case statements in RTL code (e.g., Verilog, VHDL, or the like) are manipulated to allow selectable state combination without duplication of code. Thus, for the "one hot" state machine described above, the following RTL case statements are used to combine state 1 and state 2:

```
(State[1] && !flag):
    begin
    nextState[2] = 1;
    $display("State %b => nextState %b @ %0t", State, nextState, $time);
    end
(State[1] && flag) ||
(State[2] && !flag):
    begin
    nextState[3] = 1;
    $display("State %b => nextState %b @ %0t", State, nextState, $time);
    end
```

Using these case statements, if the state machine is in State 1 and flag is not asserted, the state machine executes the State 1 logic (FIG. 3). Similarly, if the state machine is in State 1 and flag is asserted, or the state machine is in State 2, the state machine executes the State 2 logic. In this manner, the State 2 logic need not be duplicated in State 1. The State 1 logic is skipped when flag is asserted or true, and the State 2 logic is executed despite the fact that the state machine is actually in State 1 (FIG. 4). When run in simulation, the following output is produced:

```
            Compiling source file "test.v"
            Highest level modules:
            test
            Test (1): 00001 @ 4
                State 00001 => nextState 00010 @ 4
            Test (1): 00010 @ 12
                State 00010 => nextState 01000 @ 12
            Test (1): 01000 @ 20
                State 01000 => nextState 10000 @ 20
            Test (1): 10000 @ 28
            L27 "test.v": $finish at simulation time 28
```

Thus, the state machine requires 28 time units to complete State 4. For purposes of illustration, there were no decisions per se made by State 2 in the exemplary state machine described herein in order to minimize the complexity of the exemplary RTL code. Thus, the state machine proceeds from State 1 to State 3 which is the "decision" made by State 2 in the previously described execution. However, those of skill in the art will recognize that state machines employing the methods of the present invention may be provided wherein one or more decisions are made in State 2. Further, it is contemplated that state machines may be provided in accordance with the present invention, where one state (e.g., State 1) is used throughout a large amount of logic. By employing the present invention, duplication of RTL code is reduced and error associated with such duplication is minimized or eliminated.

In the embodiments of the present invention discussed herein, state machines implemented using the Verilog hardware description language (HDL) are described. However, those of skill in the art will recognized that the present invention is not necessarily limited to implementations employing Verilog HDL. Consequently, it is contemplated state machines in accordance with the present invention may be implemented using other hardware definition languages such as SystemVerilog, VHDL (VHSIC (Very High Speed Integrated Circuit) Hardware Description Language), or the like. Moreover, although a simple "one hot" state machine is described for purposes of illustration of the present invention, it is contemplated that the present invention may be used in the implementation of any state machine where it is desirable to pass from one state to another within the state machine without occupying extra clock cycles.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. In embodiments of the invention, the state machine can be implemented as sets of instructions resident in the memory of one or more computer systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for combining a first state and a second state of a state machine, the state machine being implemented using RTL code, comprising:

providing a case statement in the RTL code implementing the state machine for allowing selectable combination of the first state and the second state without duplication of RTL code implementing either of the first state or the second state based on a signal received from outside of the state machine.

2. The method as claimed in claim 1, further comprising:

receiving the signal; and executing one of the RTL code implementing the first state or the RTL code implementing the second state based on the received signal.

3. The method as claimed in claim 2, wherein the RTL code implementing the first state is executed when the state machine is in the first state and the received signal is not asserted.

4. The method as claimed in claim 3, wherein the RTL code implementing the second state is executed when the received signal is asserted.

5. The method as claimed in claim 4, wherein the RTL code implementing the second state is executed while the state machine is in the first state.

6. The method as claimed in claim 5, wherein the RTL code implementing the second state is executed without requiring an extra clock cycle.

7. The method as claimed in claim 1, wherein the case statement qualifies the RTL code implementing the first state with the received signal, the received signal being not asserted, and qualifies the RTL code implementing the second state with the received signal, the received signal being asserted, such that the state machine only executes RTL code implementing the first state when the state machine is in the first state and the received signal is not asserted, and only executes RTL code implementing the second state when either the state machine is in the first state and the received signal is asserted or the state machine is in the second state and the received signal is not asserted.

8. The method as claimed in claim 1, wherein the RTL code implementing the state machine is implemented using Verilog hardware definition language.

9. The method as claimed in claim 8, wherein the case statement provided has the form:

```
(State[1] && !flag):
   begin
   nextState[2] = 1;
```

-continued

```
   $display("State %b => nextState %b @ %0t", State, nextState, $time);
   end
(State[1] && flag) ||
(State[2] && !flag):
   begin
   nextState[3] = 1;
   $display("State %b => nextState %b @ %0t", State, nextState, $time);
   end.
```

10. A method for combining a first state and a second state of a state machine, the state machine being implemented using RTL code, comprising:

providing a case statement in the RTL code implementing the state machine for allowing selectable combination of the first state and the second state without duplication of RTL code implementing either of the first state or the second state based on a signal from outside of the state machine;

receiving the signal; and executing one of the RTL code implementing the first state or the RTL code implementing the second state based on the received signal.

11. The method as claimed in claim 10, wherein the state machine executes the RTL code implementing the first state when the state machine is in the first state and the received signal is not asserted.

12. The method as claimed in claim 11, wherein the RTL code implementing the second state is executed when the received signal is asserted.

13. The method as claimed in claim 12, wherein the RTL code implementing the second state is executed while the state machine is in the first state.

14. The method as claimed in claim 13, wherein the RTL code implementing the second state is executed without requiring an extra clock cycle.

15. The method as claimed in claim 10, wherein the case statement qualifies the RTL code implementing the first state with the received signal, the received signal being not asserted, and qualifies the RTL code implementing the second state with the received signal, the received signal being asserted, such that the state machine only executes RTL code implementing the first state when the state machine is in the first state and the received signal is not asserted, and only executes RTL code implementing the second state when either the state machine is in the first state and the received signal is asserted or the state machine is in the second state and the received signal is not asserted.

16. The method as claimed in claim 10, wherein the RTL code implementing the state machine is implemented using Verilog hardware definition language.

17. The method as claimed in claim 16, wherein the case statement provided has the form:

```
(State[1] && !flag):
   begin
   nextState[2] = 1;
   $display("State %b => nextState %b @ %0t", State, nextState, $time);
   end
(State[1] && flag) ||
(State[2] && !flag):
   begin
```

-continued

```
    nextState[3] = 1;
    $display("State %b => nextState %b @ %0t", State, nextState,
        $time);
    end.
```

18. A state machine implemented using RTL code, comprising:

a first state; and a second state, wherein a case statement in the RTL code implementing the state machine provides selectable combination of the first state and the second state without duplication of RTL code implementing either of the first state or the second state based on a signal from outside of the state machine.

19. The state machine as claimed in claim 18, wherein the RTL code implementing the first state is executed when the state machine is in the first state and the signal is not asserted.

20. The state machine as claimed in claim 19, wherein the RTL code implementing the second state is executed when the signal is asserted.

21. The state machine as claimed in claim 20, wherein the RTL code implementing the second state is executed while the state machine is in the first state.

22. The state machine as claimed in claim 21, wherein the RTL code implementing the second state is executed without requiring an extra clock cycle.

23. The state machine as claimed in claim 18, wherein the case statement qualifies the RTL code implementing the first state with the received signal, the received signal being not asserted, and qualifies the RTL code implementing the second state with the received signal, the received signal being asserted, such that the state machine only executes RTL code implementing the first state when the state machine is in the first state and the received signal is not asserted, and only executes RTL code implementing the second state when either the state machine is in the first state and the received signal is asserted or the state machine is in the second state and the received signal is not asserted.

24. The state machine as claimed in claim 18, wherein the RTL code implementing the state machine is implemented using Verilog hardware definition language.

25. The state machine as claimed in claim 24, wherein the case statement provided has the form:

```
    (State[1] && !flag):
        begin
        nextState[2] = 1;
        $display("State %b => nextState %b @ %0t", State, nextState,
            $time);
        end
    (State[1] && flag) ||
    (State[2] && !flag):
        begin
        nextState[3] = 1;
        $display("State %b => nextState %b @ %0t", State, nextState,
            $time);
        end.
```

26. A state machine implemented using RTL code, comprising:

means for providing a case statement in the RTL code implementing the state machine for allowing selectable combination of the first state and the second state without duplication of RTL code implementing either of the first state or the second state based on a signal from outside of the state machine;

means for receiving the signal;

wherein one of the RTL code implementing the first state or the RTL code implementing the second state is executed based on the received signal.

27. The state machine as claimed in claim 26, wherein the RTL code implementing the first state is executed when the state machine is in the first state and the signal is not asserted.

28. The state machine as claimed in claim 27, wherein the RTL code implementing the second state is executed when the signal is asserted.

29. The state machine as claimed in claim 28, wherein the RTL code implementing the second state is executed while the state machine is in the first state.

30. The state machine as claimed in claim 29, wherein the RTL code implementing the second state is executed without requiring an extra clock cycle.

31. The state machine as claimed in claim 26, wherein the case statement qualifies the RTL code implementing the first state with the received signal, the received signal being not asserted, and qualifies the RTL code implementing the second state with the received signal, the received signal being asserted, such that the state machine only executes RTL code implementing the first state when the state machine is in the first state and the received signal is not asserted, and only executes RTL code implementing the second state when either the state machine is in the first state and the received signal is asserted or the state machine is in the second state and the received signal is not asserted.

32. The state machine as claimed in claim 26, wherein the RTL code implementing the state machine is implemented using Verilog hardware definition language.

33. The state machine as claimed in claim 32, wherein the case statement provided has the form:

```
    (State[1] && !flag):
        begin
        nextState[2] = 1;
        $display("State %b => nextState %b @ %0t", State, nextState,
            $time);
        end
    (State[1] && flag) ||
    (State[2] && !flag):
        begin
        nextState[3] = 1;
        $display("State %b => nextState %b @ %0t", State, nextState,
            $time);
        end.
```

* * * * *